(12) United States Patent
Miks et al.

(10) Patent No.: US 6,965,159 B1
(45) Date of Patent: Nov. 15, 2005

(54) REINFORCED LEAD-FRAME ASSEMBLY FOR INTERCONNECTING CIRCUITS WITHIN A CIRCUIT MODULE

(75) Inventors: Jeffrey Alan Miks, Chandler, AZ (US); John Armando Miranda, Chandler, AZ (US)

(73) Assignee: Amkor Technology, Inc., Chandler, AZ (US)

(*) Notice: Subject to any disclaimer, the term of this patent is extended or adjusted under 35 U.S.C. 154(b) by 305 days.

(21) Appl. No.: 10/356,997

(22) Filed: Feb. 3, 2003

Related U.S. Application Data

(63) Continuation-in-part of application No. 09/956,190, filed on Sep. 19, 2001.

(51) Int. Cl.$^7$ ............................................. H01L 23/495
(52) U.S. Cl. ...................... 257/676; 257/679; 257/787; 438/106
(58) Field of Search ............................... 257/676, 679, 257/787; 438/106

(56) References Cited

U.S. PATENT DOCUMENTS

| | | |
|---|---|---|
| 2,596,993 A | 5/1952 | Gookin |
| 3,435,815 A | 4/1969 | Forcier |
| 3,734,660 A | 5/1973 | Davies et al. |
| 3,838,984 A | 10/1974 | Crane et al. |
| 4,054,238 A | 10/1977 | Lloyd et al. |
| 4,189,342 A | 2/1980 | Kock |
| 4,258,381 A | 3/1981 | Inaba |
| 4,289,922 A | 9/1981 | Devlin |
| 4,301,464 A | 11/1981 | Otsuki et al. |
| 4,332,537 A | 6/1982 | Slepcevic |
| 4,417,266 A | 11/1983 | Grabbe |
| 4,451,224 A | 5/1984 | Harding |
| 4,530,152 A | 7/1985 | Roche et al. |
| 4,646,710 A | 3/1987 | Schmid et al. |
| 4,707,724 A | 11/1987 | Suzuki et al. |
| 4,737,839 A | 4/1988 | Burt |
| 4,756,080 A | 7/1988 | Thorp, Jr. et al. |
| 4,812,896 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Schlesinger et al. |
| 5,029,386 A | 7/1991 | Chao et al. |
| 5,041,902 A | 8/1991 | McShane |
| 5,059,379 A | 10/1991 | Tsutsumi et al. |

(Continued)

FOREIGN PATENT DOCUMENTS

DE 19734794 A1 8/1997

(Continued)

OTHER PUBLICATIONS

JEDEC Solid State Product Outline, "2 Lead Header Family Surface Mounted (Peripheral Terminals)", 4 pages.

(Continued)

*Primary Examiner*—Luan Thai
(74) *Attorney, Agent, or Firm*—Stetina Brunda Garred & Brucker

(57) ABSTRACT

A lead-frame method and assembly for interconnecting circuits within a circuit module allows a circuit module to be fabricated without a circuit board substrate. Integrated circuit dies are attached to a metal lead-frame assembly and the die interconnects are wire-bonded to interconnect points on the lead-frame assembly. An extension of the lead-frame assembly out of the circuit interconnect plane provides external electrical contacts for connection of the circuit module to a socket.

20 Claims, 6 Drawing Sheets

U.S. PATENT DOCUMENTS

| | | |
|---|---|---|
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,424,576 A | 6/1995 | Djennas et al. |
| 5,428,248 A | 6/1995 | Cha |
| 5,435,057 A | 7/1995 | Bindra et al. |
| 5,444,301 A | 8/1995 | Song et al. |
| 5,454,905 A | 10/1995 | Fogelson |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,604,376 A | 2/1997 | Hamburgen et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,639,990 A | 6/1997 | Nishihara et al. |
| 5,640,047 A | 6/1997 | Nakashima |
| 5,641,997 A | 6/1997 | Ohta et al. |
| 5,644,169 A | 7/1997 | Chun |
| 5,646,831 A | 7/1997 | Manteghi |
| 5,650,663 A | 7/1997 | Parthasarathi |
| 5,665,996 A | 9/1997 | Williams et al. |
| 5,673,479 A | 10/1997 | Hawthorne |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,736,432 A | 4/1998 | Mackessy |
| 5,745,984 A | 5/1998 | Cole, Jr. et al. |
| 5,753,977 A | 5/1998 | Kusaka et al. |
| 5,766,972 A | 6/1998 | Takahashi et al. |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,856,911 A | 1/1999 | Riley |
| 5,859,471 A | 1/1999 | Kuraishi et al. |
| 5,866,939 A | 2/1999 | Shin et al. |
| 5,871,782 A | 2/1999 | Choi |
| 5,874,784 A | 2/1999 | Aoki et al. |
| 5,877,043 A | 3/1999 | Alcoe et al. |
| 5,886,398 A | 3/1999 | Low et al. |
| 5,894,108 A | 4/1999 | Mostafazadeh et al. |
| 5,897,339 A | 4/1999 | Song et al. |
| 5,900,676 A | 5/1999 | Kweon et al. |
| 5,903,049 A | 5/1999 | Mori |
| 5,903,050 A | 5/1999 | Thurairajaratnam et al. |
| 5,917,242 A | 6/1999 | Ball |
| 5,939,779 A | 8/1999 | Kim |
| 5,942,794 A | 8/1999 | Okumura et al. |
| 5,951,305 A | 9/1999 | Haba |
| 5,959,356 A | 9/1999 | Oh |
| 5,973,388 A | 10/1999 | Chew et al. |
| 5,976,912 A | 11/1999 | Fukutomi et al. |
| 5,977,613 A | 11/1999 | Takata et al. |
| 5,977,615 A | 11/1999 | Yamaguchi et al. |
| 5,977,630 A | 11/1999 | Woodworth et al. |
| 5,981,314 A | 11/1999 | Glenn et al. |
| 5,986,333 A | 11/1999 | Nakamura |
| 5,986,885 A | 11/1999 | Wyland |
| 6,001,671 A | 12/1999 | Fjelstad |
| 6,013,947 A | 1/2000 | Lim |
| 6,018,189 A | 1/2000 | Mizuno |
| 6,025,640 A | 2/2000 | Yagi et al. |
| 6,031,279 A | 2/2000 | Lenz |
| RE36,613 E | 3/2000 | Ball |
| 6,034,423 A | 3/2000 | Mostafazadeh et al. |
| 6,040,626 A | 3/2000 | Cheah et al. |
| 6,043,430 A | 3/2000 | Chun |
| 6,060,768 A | 5/2000 | Hayashida et al. |
| 6,060,769 A | 5/2000 | Wark |
| 6,072,228 A | 6/2000 | Hinkle et al. |
| 6,075,284 A | 6/2000 | Choi et al. |
| 6,081,029 A | 6/2000 | Yamaguchi |
| 6,084,310 A | 7/2000 | Mizuno et al. |
| 6,087,722 A | 7/2000 | Lee et al. |
| 6,100,594 A | 8/2000 | Fukui et al. |
| 6,113,473 A | 9/2000 | Costantini et al. |
| 6,118,174 A | 9/2000 | Kim |
| 6,118,184 A | 9/2000 | Ishio et al. |
| RE36,907 E | 10/2000 | Templeton, Jr. et al. |
| 6,130,115 A | 10/2000 | Okumura et al. |
| 6,130,473 A | 10/2000 | Mostafazadeh et al. |
| 6,133,623 A | 10/2000 | Otsuki et al. |
| 6,140,154 A | 10/2000 | Hinkle et al. |
| 6,143,981 A | 11/2000 | Glenn |

| | | |
|---|---|---|
| 6,169,329 B1 | 1/2001 | Farnworth et al. |
| 6,177,718 B1 | 1/2001 | Kozono |
| 6,181,002 B1 | 1/2001 | Juso et al. |
| 6,184,465 B1 | 2/2001 | Corisis |
| 6,194,777 B1 | 2/2001 | Abbott et al. |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,554 B1 | 3/2001 | Ewer et al. |
| 6,208,020 B1 | 3/2001 | Minamio et al. |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,218,731 B1 | 4/2001 | Huang et al. |
| 6,222,258 B1 | 4/2001 | Asano et al. |
| 6,225,146 B1 | 5/2001 | Yamaguchi et al. |
| 6,229,200 B1 | 5/2001 | Mclellan et al. |
| 6,229,205 B1 | 5/2001 | Jeong et al. |
| 6,239,384 B1 | 5/2001 | Smith et al. |
| 6,242,281 B1 | 6/2001 | Mclellan et al. |
| 6,256,200 B1 | 7/2001 | Lam et al. |
| 6,281,566 B1 | 8/2001 | Magni |
| 6,281,568 B1 | 8/2001 | Glenn et al. |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,307,272 B1 | 10/2001 | Takahashi et al. |
| 6,309,909 B1 | 10/2001 | Ohgiyama |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,339,255 B1 | 1/2002 | Shin |
| 6,355,502 B1 | 3/2002 | Kang et al. |
| 6,369,454 B1 | 4/2002 | Chung |
| 6,373,127 B1 | 4/2002 | Baudouin et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,395,578 B1 | 5/2002 | Shin et al. |
| 6,400,004 B1 | 6/2002 | Fan et al. |
| 6,444,499 B1 | 9/2002 | Swiss et al. |
| 6,448,633 B1 | 9/2002 | Yee et al. |
| 6,452,279 B2 | 9/2002 | Shimoda |
| 6,464,121 B2 | 10/2002 | Reijnders |
| 6,482,680 B1 | 11/2002 | Khor et al. |
| 6,498,099 B1 | 12/2002 | McLellan et al. |
| 6,498,392 B2 | 12/2002 | Azuma |
| 6,507,120 B2 | 1/2003 | Lo et al. |
| 6,603,196 B2 * | 8/2003 | Lee et al. .................. 257/676 |
| 6,624,005 B1 | 9/2003 | DiCaprio et al. |
| 2001/0008305 A1 | 7/2001 | McLellan et al. |
| 2001/0014538 A1 | 8/2001 | Kwan et al. |
| 2002/0011654 A1 | 1/2002 | Kimura |
| 2002/0024122 A1 | 2/2002 | Jung et al. |
| 2002/0140061 A1 | 10/2002 | Lee |
| 2002/0140068 A1 | 10/2002 | Lee et al. |

FOREIGN PATENT DOCUMENTS

| | | |
|---|---|---|
| EP | 54021117 | 6/1979 |
| EP | 59050939 | 3/1984 |
| EP | 0720225 | 3/1996 |
| EP | 1032037 | 8/2000 |
| JP | 55163868 | 12/1980 |
| JP | 5745959 | 3/1982 |
| JP | 58160095 | 8/1983 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 629639 | 1/1987 |
| JP | 63205935 | 8/1988 |
| JP | 63233555 | 9/1988 |
| JP | 63249345 | 10/1988 |
| JP | 63316470 | 12/1988 |
| JP | 64054749 | 3/1989 |
| JP | 1106456 | 4/1989 |
| JP | 4098864 | 3/1992 |
| JP | 5129473 | 5/1993 |
| JP | 5166992 | 7/1993 |
| JP | 5283460 | 10/1993 |
| JP | 692076 | 4/1994 |
| JP | 6260532 | 9/1994 |
| JP | 7297344 | 11/1995 |
| JP | 7312405 | 11/1995 |
| JP | 864634 | 3/1996 |
| JP | 8125066 | 5/1996 |
| JP | 8222682 | 8/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| JP | 9293822 | 11/1997 |
| JP | 10199934 | 7/1998 |
| JP | 10256240 | 9/1998 |
| JP | 10022447 | 10/1998 |
| JP | 00150785 | 5/2000 |
| KR | 941979 | 1/1994 |
| KR | 199772358 | 11/1997 |
| KR | 100220154 | 6/1999 |
| KR | 0049944 | 6/2002 |
| WO | 9956316 | 11/1999 |
| WO | 9967821 | 12/1999 |

OTHER PUBLICATIONS

Mannion, P., "MOSFETs Break Out of the Shackles of Wirebonding", Electronic Design, vol. 47, #6 (Mar. 22, 1999).

Micro Electronics Packaging Handbook, 1989, edited by R. Tummala & E. Rymaszewski, pubished by Van Nostrand Reinhold, New York, NY.

National Semiconductor Application Note 1187, "Leadless Leadframe Package (LLP)", Oct., 2002, http://www.national.com/an/ANIAN-1187.pdf.

Vishay Siliconix Press Release, http://www.siliconix.com/www/200/pr98/4430.html, Dec. 9, 1998, pp. 1-3.

* cited by examiner

REINFORCED LEAD-FRAME ASSEMBLY FOR INTERCONNECTING CIRCUITS WITHIN A CIRCUIT MODULE

CROSS-REFERENCE TO RELATED APPLICATION

The present application is a continuation-in-part of U.S. application Ser. No. 09/956,190 entitled LEAD-FRAME METHOD AND ASSEMBLY FOR INTERCONNECTING CIRCUITS WITHIN A CIRCUIT MODULE filed Sep. 19, 2001.

STATEMENT RE: FEDERALLY SPONSORED RESEARCH/DEVELOPMENT (Not Applicable)

BACKGROUND OF THE INVENTION

1. Field of the Invention

The present invention relates generally to circuit modules and, more specifically, to a method and assembly for interconnecting circuits within a circuit module.

2. Description of the Related Art

Circuit modules or cards are increasing in use to provide storage and other electronic functions for devices such as digital cameras, personal computing devices and personal digital assistants (PDAs). New uses for circuit modules include multimedia cards and secure digital cards.

Typically, circuit modules contain multiple integrated circuit devices or "dies". The dies are interconnected using a circuit board substrate, which adds to the weight, thickness and complexity of the module. Circuit modules also have electrical contacts for providing an external interface to the insertion point or socket, and these electrical contacts are typically circuit areas on the backside of the circuit board substrate, and the connection to the dies are provided through vias through the circuit board substrate. Producing vias in the substrate adds several process steps to the fabrication of the circuit board substrate, with consequent additional costs.

Therefore, it would be desirable to provide a method and assembly for interconnecting circuits within modules that requires no circuit board substrate. It would also be desirable to provide an assembly for interconnecting circuits within a module that, in addition to not including a circuit board substrate, is specifically configured to be resistant to fracture failures.

BRIEF SUMMARY OF THE INVENTION

A circuit module assembly and method for interconnecting circuits within modules to provide a circuit module that may be fabricated without a circuit board substrate. A lead-frame assembly is connected to one or more dies and external contacts may be provided by an extension of the lead-frame assembly out of the plane of the die interconnect.

More particularly, in accordance with the present invention there is provided a circuit module which comprises a lead-frame having at least one die pad, a plurality of contacts, a plurality of conductive traces extending from respective ones of the contacts toward the die pad, and at least one reinforcement bar. Attached to the die pad is a semiconductor die which is electrically connected to at least one of the traces. A body at least partially encapsulates the lead-frame and the semiconductor die such that the contacts are exposed within a bottom surface defined by the body, and at least a portion of the body is reinforced by the reinforcement bar.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1A:
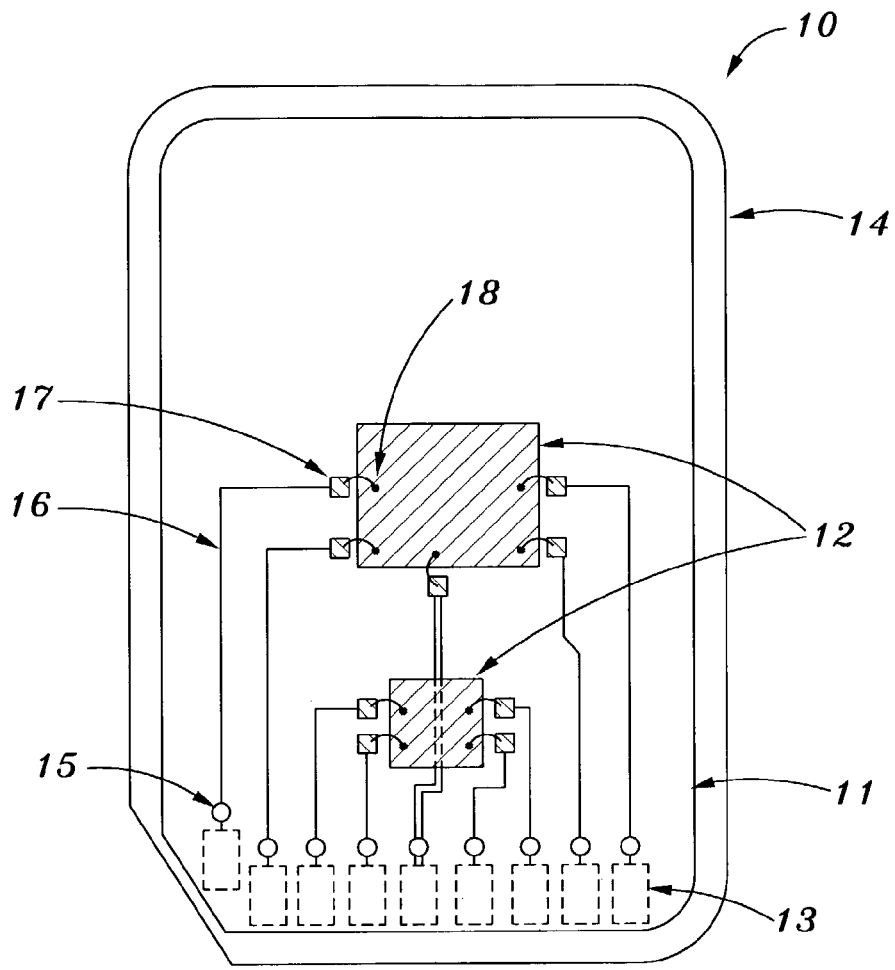
FIG. 1A is a pictorial diagram depicting a top view and FIG. 1B is a pictorial diagram depicting a cross section of a prior art circuit module.

Referring now to the figures and in particular to FIG. 1A, a top view of a prior art circuit module 10 is depicted. Circuit module 10 is depicted as a circuit module as used in various multimedia card memory applications. The present invention is also applicable to cards and modules having other outlines such as secure digital cards and to peripheral device cards (I/O cards), as well.

A carrier 14, to which integrated circuit dies 12 are attached and circuit contacts 13 are included on the bottom side, is covered by a cover 11 that is bonded to carrier 14. The circuit module housing may be completely formed from an encapsulant, or the circuit may be encapsulated and a lid 15 applied over the encapsulant. Dies 12 are coupled to each other and to circuit contacts 13 by circuit traces 16, which are typically etched from a metal layer on the top of carrier 14. Circuit contacts 13 are coupled by means of plated-through holes 15 that pass through carrier 14. The bottom side of carrier 14 is also typically etched from a metal layer on the bottom side forming electrical contacts 13 that are generally plated with a corrosion resistant material such as gold and circuit contacts 13 connect on the bottom side of carrier 14 to plated through holes 15 by circuit traces on the bottom side of carrier 14. Circuit traces 16 include wire bonding areas 17 that may also be plated, permitting a wire bonding apparatus to electrically couple dies 12 by wires 18.

Figure 1B:
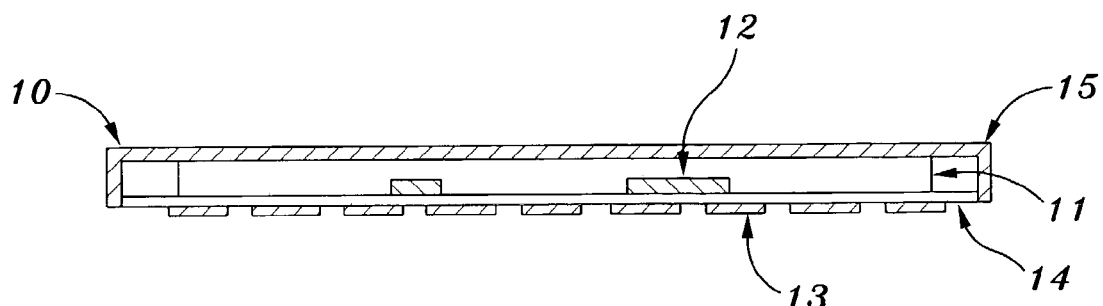

Referring now to FIG. 1B, a cross section end view of circuit module 10 is depicted. Dies 12 are covered by cover 11 and are bonded to carrier 14. Circuit contacts 13 are disposed on the bottom side of carrier 14 to provide electrical connections to the external circuits via a socket in which circuit module 10 is inserted.

The present invention provides a circuit module that does not require a separate carrier, wherein the circuit paths between dies 12 and electrical contacts 13 are provided by a conductive lead-frame to which dies 12 are bonded and an encapsulant applied surrounding the lead-frame to provide support and electrical insulation.

Figure 2A:
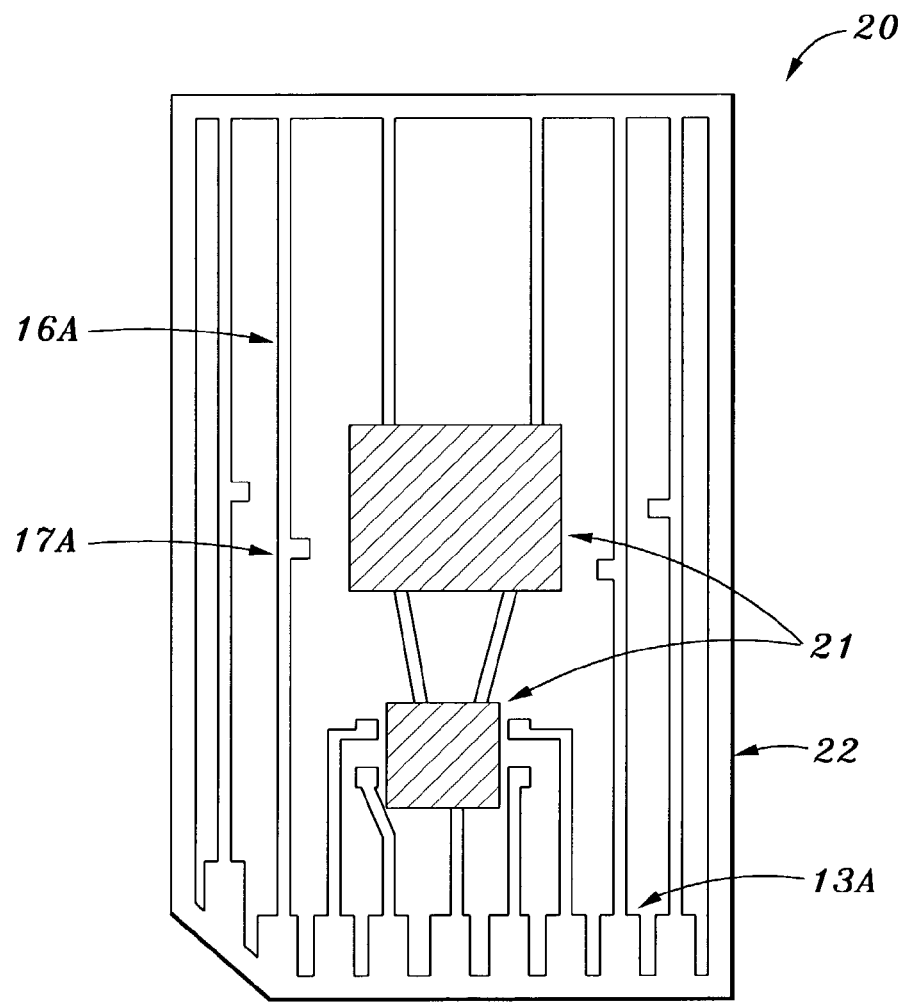
FIG. 2A is a pictorial diagram depicting a top view and FIG. 2B is a pictorial diagram depicting a cross section of a lead-frame in accordance with an embodiment of the invention.

Referring now to FIG. 2A, a top view of a lead-frame 20 in accordance with an embodiment of the invention is depicted. Circuit traces 16A are supported by a dam bar 22 that surrounds the periphery of the lead-frame 20, providing rigidity during the fabrication and integration processes. Lead-frame 20 is generally stamped from a metal, such as copper, and integrated circuit dies are bonded to lead-frame 20 in die bonding areas 21. Wire bonding pads 17A are provided on circuit traces 16A to permit attachment of wires from dies to the lead-frame 20. The lead-frame 20 is then encapsulated and portions of dam bar 22 are cut, resulting in electrical isolation of circuit traces 16A, after mechanical rigidity has been provided by the encapsulant.

In addition or in alternative to wire bonding pads 17A, pads may be included for attachment of surface mounted passive components by soldering or conductive adhesive attachment, and pad grids may be included for attachment of pre-packaged integrated circuits.

Figure 2B:
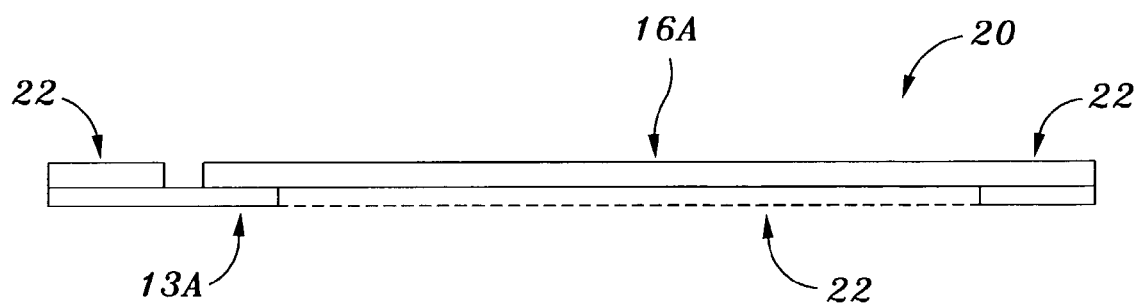

Referring now to FIG. 2B, a cross-section side view of lead-frame 20 is depicted. Dam bar 22 is shown at ends of the lead-frame 20 and is cut-away along the sides in the figure to illustrate that circuit traces 17A are a half-thickness of metal with respect to dam bar 22. This half-thickness may be produced by etching the bottom side of lead-frame 20 after applying an etchant resistant coating to dam bar and circuit contacts 13A. Circuit contacts 13A are also partially a half-thickness of metal, produced by etching the top side of lead-frame 20 after applying an etchant resistive coating to circuit traces 16A and dam bar 22. The etching of both sides of lead-frame 20 results in a circuit that has circuit contacts 13A disposed as an extension out of the plane of circuit traces 16A, while the full thickness portion of the electrical contacts/circuit trace combination produces a continuous conductive and mechanically rigid connection from circuit traces 16A to circuit contacts 13A. Thus, encapsulant may be applied beneath circuit traces 16A and the circuit contact 13A surfaces may protrude from the encapsulant, providing an interface connection external to a circuit module.

As an alternative, circuit contacts 13A may be fabricated in the same plane as circuit traces 16A and additional length supplied so that the circuit traces may be bent to provide an extension out of the plane of circuit traces 16A so that circuit contacts 13A may protrude from an encapsulant applied beneath lead-frame 20.

The illustrative embodiments herein depict an etched lead-frame, but lead-frames may also be stamped in accordance with an embodiment of the present invention. The alternative embodiment depicted, wherein circuit traces are bent to provide circuit contacts especially lends itself to stamping, because the circuit traces may be formed and bent in a single stamping operation.

Figure 3A:
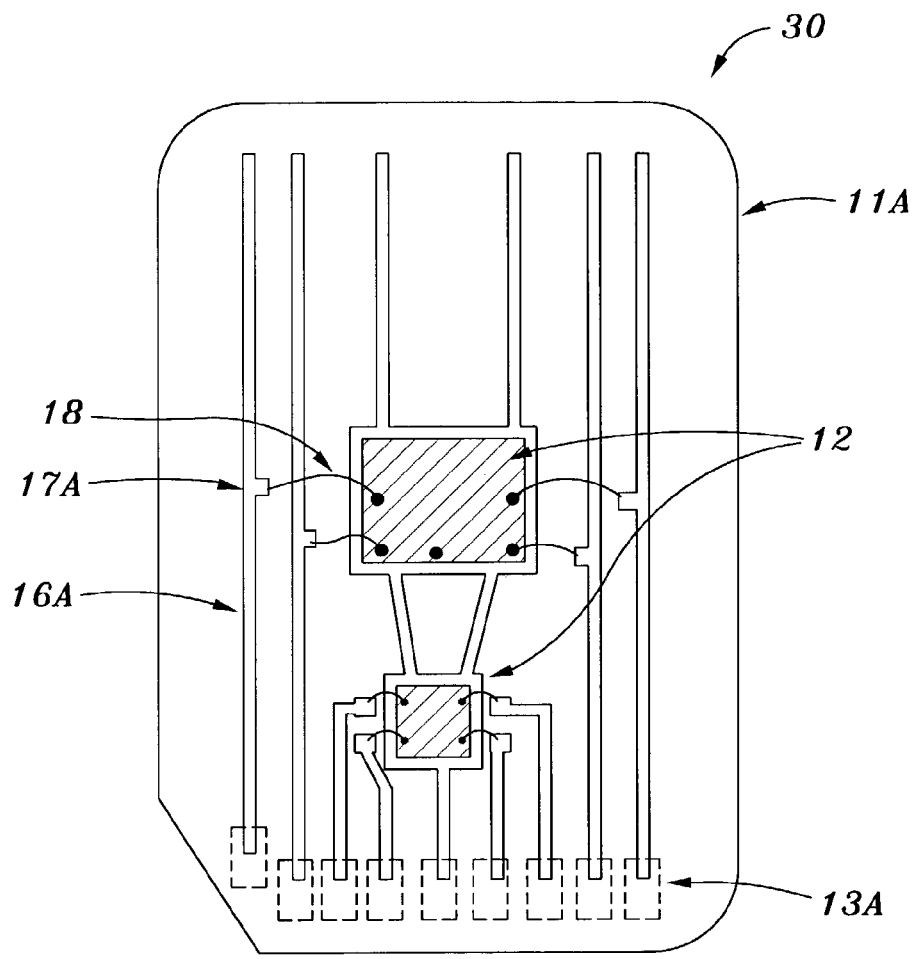
FIG. 3A is a pictorial diagram depicting a top view and FIG. 3B is a pictorial diagram depicting a cross section of a circuit module in accordance with an embodiment of the invention.

Referring now to FIG. 3A, a top view of a circuit module 30, in accordance with an embodiment of the invention, is depicted. The depiction shows the internal features after dies 12 have been bonded to lead-frame 20, an encapsulant cover 11A applied and the dam bar 22 is singulated from circuit module 30. The resulting circuit module 30 has circuit traces 16A that are isolated (but supported by the encapsulant) and wires 18 have been bonded from dies 12 to bonding pads 17A. Circuit contacts 13A are located at the bottom surface of encapsulant cover 11A and protrude from or are conformal to the bottom surface to provide an external electrical connection.

Figure 3B:
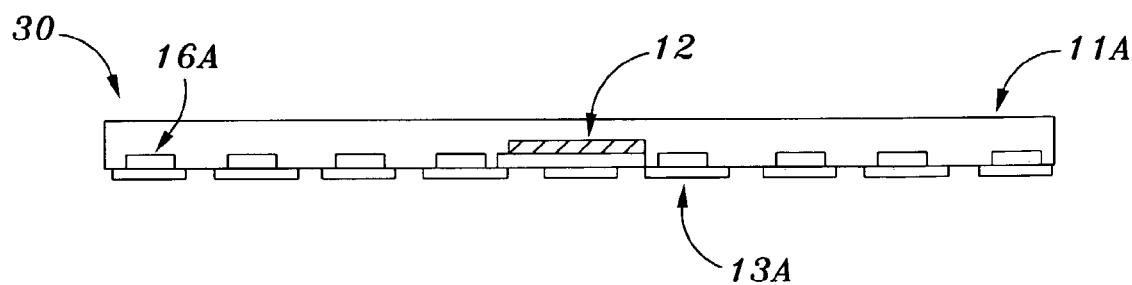

Referring now to FIG. 3B, a cross-section end view of a circuit module 30, in accordance with an embodiment of the invention, is depicted. The plane of circuit traces 16A adjacent to the plane of circuit contacts 13A may be seen from the figure. Die 12 is shown as mounted above the plane of circuit traces 16A, but a mounting within the plane of circuit traces 16A is also possible. Additionally, circuit contacts 13A may be attached using plating techniques to attach to circuit traces 16A rather than including the circuit contacts 13A within the lead-frame 20.

As shown in FIG. 3A, in the circuit module 30, a relatively large minimally reinforced area of the encapsulant cover 11A is defined between that die bonding area 21 disposed furthest from the circuit contacts 13A, and the lateral side or edge of the encapsulant cover 11A which is disposed furthest from the circuit contacts 13A. The encapsulant material used to form the encapsulant cover 11A is relatively brittle upon hardening, and is susceptible to fracture failure at consistent stress concentration points resulting from applied bending loads which sometimes are exerted during normal handling conditions. The encapsulant material in the above-described area is particularly susceptible to such fracture failure as a result of the absence of a high concentration of reinforcement members extending therein, i.e., only portions of the circuit traces 16A extend within the encapsulant material in such area. This particular problem is exaggerated in those instances when the lead-frame 20 is formed in an alternative configuration, such as one wherein the larger die bonding area 21 disposed furthest from the circuit contacts 13A is not included in the lead-frame 20.

Figure 4:
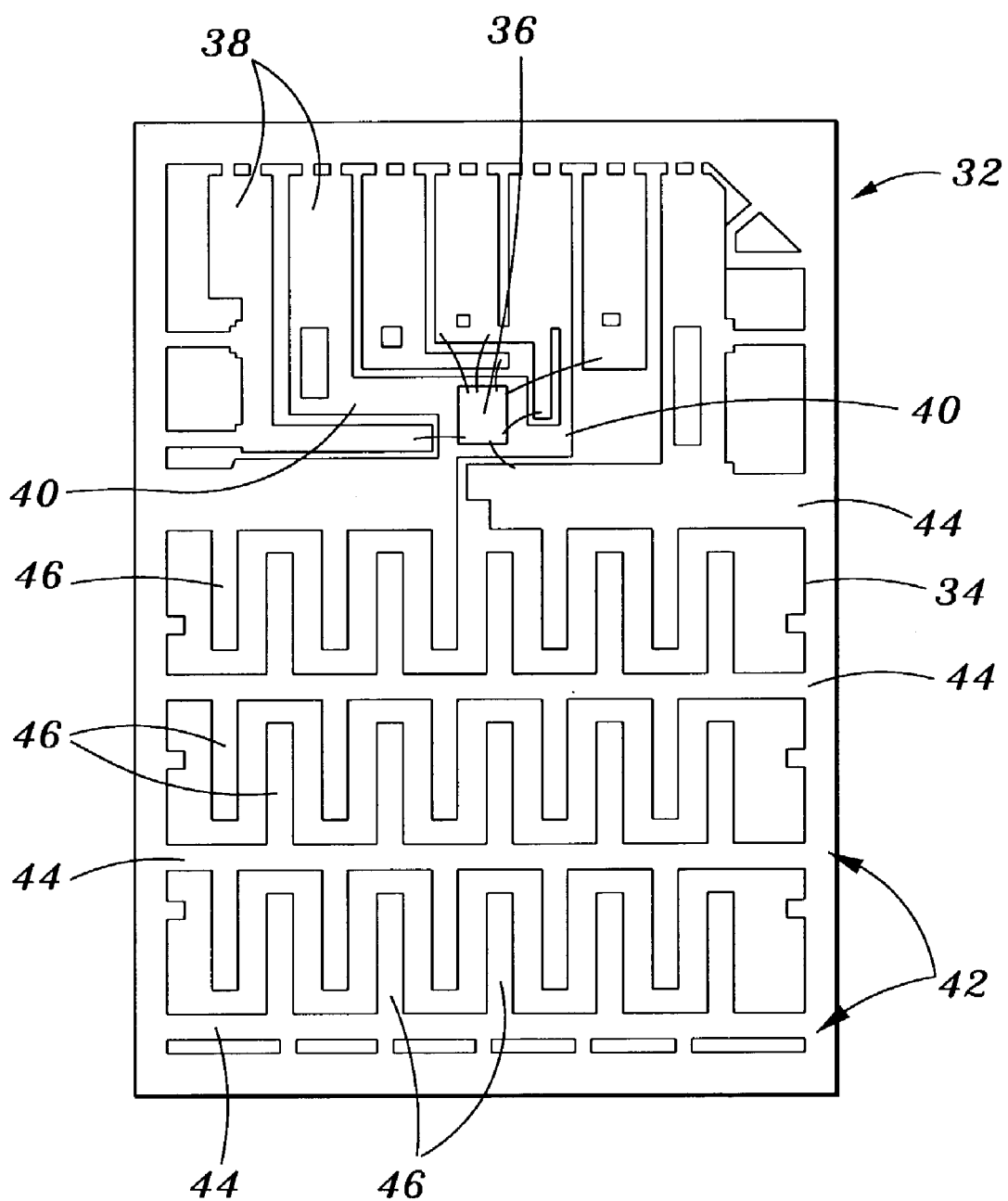
FIG. 4 is a top plan view of a lead-frame constructed in accordance with an alternative embodiment of the present invention to include an interleaf reinforcement for facilitating the prevention of fracture failure in the circuit module.

Referring now to FIG. 4, there is shown a lead-frame 32 constructed in accordance with an alternative embodiment of the present invention specifically adapted to address the fracture failure susceptibility in the encapsulant material described above. The lead-frame 32 comprises an outer frame or dam bar 34. The dam bar 34 has a generally rectangular configuration defining an opposed pair of longitudinal sides or segments and an opposed pair of lateral sides or segments. The dam bar 34 further defines a fifth sloped side which extends angularly between one of the lateral sides and one of the longitudinal sides thereof.

In addition to the dam bar 34, the lead-frame 32 includes at least one die attach area such as a die pad 36 which is disposed within the interior of the dam bar 34. The die pad 36 defines opposed, generally planar top and bottom surfaces. Integrally connected to and extending inwardly from the lateral side of the dam bar 34 extending to the sloped side thereof is a plurality of contacts 38 of the lead-frame 32. Each of the contacts 38 also defines opposed, generally planar top and bottom surfaces. Integrally connected to and extending from each of the contacts 38 is an elongate conductive trace 40. Certain ones of the traces 40 are integrally connected to the dam bar 34. Each of the traces 40 terminates in close proximity to respective ones of the peripheral sides of the die pad 36.

The lead-frame 32 further comprises a plurality of interleaf reinforcement bars 42. Each of the reinforcement bars 42 comprises an elongate base section 44 having a plurality of fingers 46 integrally connected to and extending perpendicularly from either a common longitudinal side thereof or each of the opposed longitudinal sides thereof. In the lead-frame 32, the base section 44 of one of the reinforcement bars 42 including only one set of fingers 46 is attached to the lateral side of the dam bar 34 disposed furthest from the contacts 38. Additional reinforcement bars 42 which also each include only one set of fingers 46 protruding from the base sections 44 thereof are disposed side-by-side adjacent the die pad 36 and are attached to respective ones of the longitudinal sides of the dam bar 34. One of these particular reinforcement bars 42 is also integrally connected to the die pad 36. Disposed between these two reinforcement bars 42 and the reinforcement bar 42 attached to the lateral side of the dam bar 34 are two additional reinforcement bars 42, each of which includes two sets of fingers 46 extending from the base section 44 thereof. Importantly, the reinforcement bars 42 are sized, configured, and oriented relative to each other within the dam bar 34 such that the fingers 46 thereof are interleaved, thus facilitating the formation of serpentine gaps or openings between the reinforcement bars 42.

To form a circuit module through the use of the lead-frame 32, a semiconductor die 48 is preferably attached to the bottom surface of the die pad 36 through the use of an epoxy or adhesive. Subsequent to such attachment, the terminals 50 of the semiconductor die 48 are electrically connected to respective ones of the traces 40 of the lead-frame 32 through the use of conductive wires 52. The conductive wires 52 effectively place the terminals 50 of the semiconductor die 48 into electrical communication with the lead-frame 32 and, more particularly, respective ones of the contacts 38 thereof.

Figure 5:
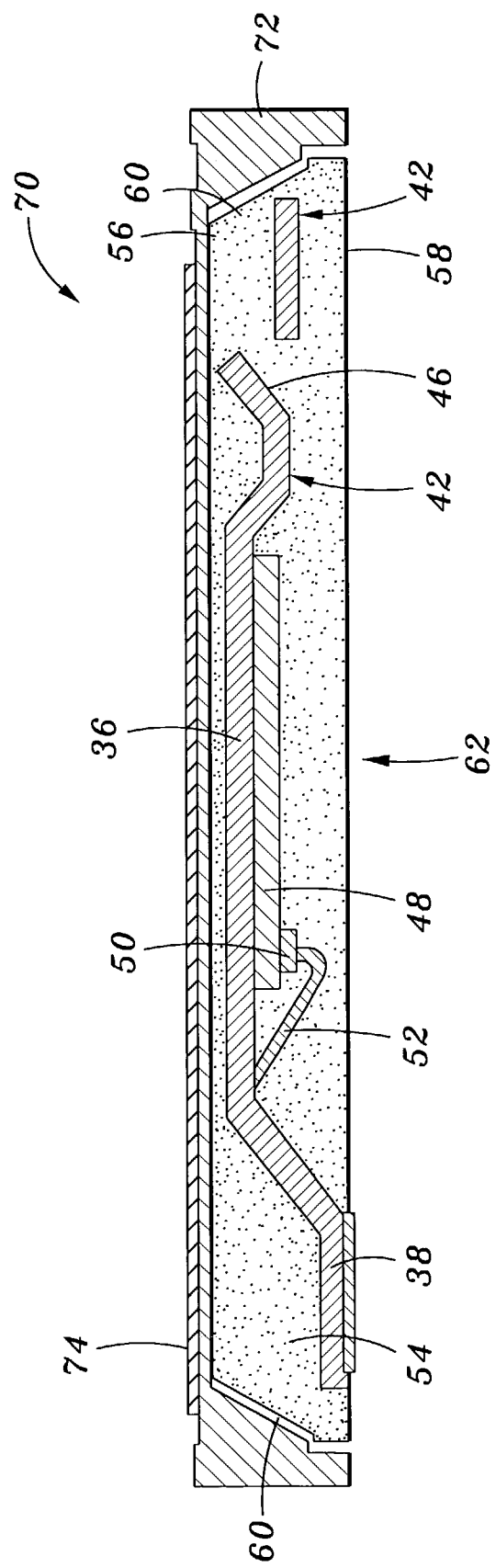
FIG. 5 is a cross-sectional view of the circuit module of the present invention illustrating a portion of the interleaf reinforcement of the lead-frame as optionally bended in the z-direction.

Subsequent to the electrical connection of the semiconductor die 48 to the lead-frame 32 in the above-described manner, the lead-frame 32 is preferably subjected to a bending operation wherein the traces 40 are bent so as to facilitate the creation of an angled or sloped portion therein which is located between the contacts 38 and the die pad 36 as shown in FIG. 5. Bending of the traces 40 removes the contacts 38 from their original co-planar relationship to the die pad 36. Thus, the contacts 38 and the die pad 36 extend along spaced, generally parallel planes. The bending of the lead-frame 32 in the above-described manner may occur either prior to the attachment of the semiconductor die 48 to the die pad 36, or subsequent to the extension of the conductive wires 52 between the terminals 50 and traces 40. It should be noted that in FIG. 5, the lead-frame 32 is depicted as including a lesser number of reinforcement bars 42 as compared to the showing in FIG. 4. In this regard, those of ordinary skill in the art will recognize that any number of reinforcement bars 42 may be included in the lead-frame 32, with the number and placement of such reinforcement bars 42 being dependent on various parameters and, most notably, the size of the space or gap defined between the die pad disposed furthest from the contacts 38 and the longitudinal side of the dam bar 34 disposed furthest from the contacts 38.

Subsequent to the bending of the lead-frame 32, an encapsulant material is applied to the lead-frame 32, semiconductor die 48, and conductive wires 52. The encapsulant material is preferably a plastic (e.g., thermoset, thermoplastic) which, upon hardening, forms a body 54. The completely formed body 54 defines a generally planar top surface 56, an opposed, generally planar bottom surface 58, and angled or sloped side surfaces 60. The package body 54 is preferably formed such that the bottom surfaces of the contacts 38 are exposed within and generally flush with the bottom surface 58 of the body 54. As seen in FIG. 5, the body 54 may be formed such that the top surface of the die pad 36 (i.e., the surface opposite that including the semiconductor die 48 attached thereto) is covered by the body 54. Alternatively, the body 54 may be formed such that the top surface of the die pad 36 is exposed in and substantially flush with the top surface 56 of the body 54. Subsequent to the formation of the body 54, the lead-frame 32 is cut or singulated in a manner facilitating the removal of the dam bar 34 as is needed to electrically isolate the traces 40 and hence the contacts 38 from each other. In this regard, the body 54 is preferably formed on the lead-frame 32 such that the dam bar 34 remains exposed (i.e., is not covered by the body 54). The exposure of the dam bar 34 allows for the removal of the same from the completely formed body 54.

The formation of the body 54 completes the fabrication of a circuit module 62 which includes the lead-frame 32, semiconductor die 48, conductive wires 52, and body 54. In the circuit module 62, the semiconductor die 48 is in a "die down" configuration. More particularly, the semiconductor die 48 is directed downwardly within the circuit module 62 since it is located between the bottom surface of the die pad 36 and the bottom surface 58 of the body 54. As indicated above, the bottom surfaces of the contacts 38 are exposed within the bottom surface 58 of the body 54, and define the connector of a memory card in which the circuit module 62 may ultimately be employed.

Though the lead-frame 32 shown in FIG. 4 includes a total of seven contacts 38, those of ordinary skill in the art will recognize that the lead-frame 32 may be formed to include any number of contacts 38 depending on the desired application. Along these lines, the lead-frame 32 shown in FIG. 4 may further be alternatively configured to define two or more die pads for accommodating additional semiconductor dies or other devices. Further, more than one semiconductor die or other device could be attached to a single die pad. Thus, the configuration of the lead-frame 32 shown in FIGS. 4 and 5 is exemplary only, in that the number of die pads, contacts, and conductive traces may be varied as needed to satisfy the requirements of a particular application. As indicated above, also variable is the number of reinforcement bars 42 included in the lead-frame 32.

As will be recognized, in the lead-frame 32, the traces 40 must be of sufficient length to facilitate the bending thereof in the above-described manner. Additionally, those of ordinary skill in the art will recognize that the circuit module 62 may be formed in a manner wherein the lead-frame 32 is not subjected to any bending operation, but rather is subjected to a half-etch process to create regions of reduced thickness therein as shown in relation to the lead-frame 20 in FIG. 2B. In such half-etched version of the lead-frame 32, the semiconductor die 48 would be attached to the top surface of the die pad 36. The half-etching would preferably be facilitated in a manner wherein the bottom surfaces of the contacts 38 and the bottom surface of the die pad 36 extend along respective ones of a spaced, generally parallel pair of planes.

Figure 4A:
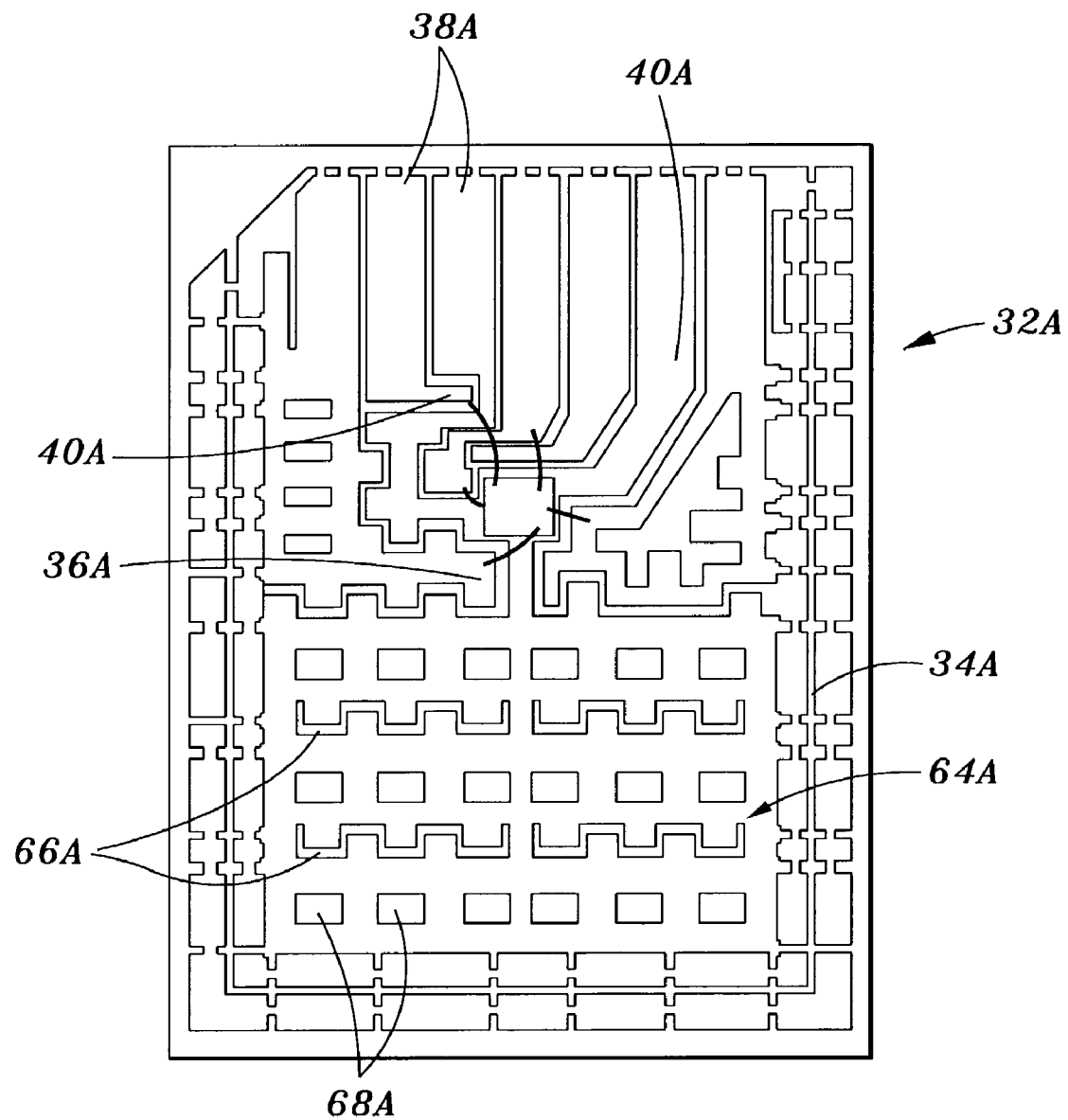
FIG. 4A is a top plan view of a lead-frame including an interleaf reinforcement formed in an alternative configuration to that shown in FIG. 4.

Referring now to FIG. 4A, an exemplary lead-frame 32A which may be employed in the circuit module 62 as an alternative to the lead-frame 32 is shown. In its preliminary, unbent state, the lead-frame 32A also comprises an outer frame or dam bar 34A. The dam bar 34A has a generally rectangular configuration defining an opposed pair of longitudinal sides or segments and an opposed pair of lateral sides or segments. The dam bar 34A further defines a fifth sloped side which extends angularly between one of the lateral sides and one of the longitudinal sides thereof.

In addition to the dam bar 34A, the lead-frame 32A includes a die attach area or die pad 36A which is disposed within the interior of the dam bar 34A. Integrally connected to and extending from one lateral side of the dam bar 34A is a plurality of contacts 38A of the lead-frame 32A. Integrally connected to and extending from each of the contacts 38A is a conductive trace 40A. The traces 40A terminate in close proximity to the die pad 36A. Disposed within the dam bar 34A between the die pad 36A and the lateral side of the dam bar 34A disposed furthest from the contacts 38A is a reinforcement structure 64A. The reinforcement structure 64A is integrally connected to the die pad 36A, and both longitudinal sides and the outermost lateral side of the dam bar 34A. Formed within the reinforcement structure 64A is a plurality of serpentine gaps 66A and generally square or rectangular gaps 68A. In this alternative embodiment of the lead-frame 32A, the conductive traces 40A may also be bent in the same manner previously described in relation to the lead-frame 32. As an alternative, the lead-frame 32A may be subjected to a half-etching technique to impart the thickness variations also described above in relation to the lead-frame 32.

In the circuit module 62 including either the lead-frame 32 or the lead-frame 32A, the reinforcement bar(s) 42 of the lead-frame 32 or the reinforcement section 64A of the lead-frame 32A provides internal reinforcement to the circuit module 62 which assists in preventing fracture failure or breaking. Certain ones of the reinforcement bars 42 or the reinforcement structure 64A which are each integrally connected to the die pad 36, 36A also provide a path for thermal spreading/dissipation. Thus, the configuration of the lead-frames 32, 32A improves mechanical performance and durability for the circuit module 62. The improved mechanical performance relates to the increased resistance to bending and twisting (torsion) attributable to the inclusion of either the reinforcement bars 42 or reinforcement structure 64A. Typically, the lead-frames 32, 32A will be configured in a manner wherein the reinforcements are disposed closest to the planes of maximum tension and compression. Though not shown, such location could be between the die pad 36, 36A and the contacts 38, 38A.

Referring again to FIG. 5, circuit module 62 including either the lead-frame 32 or lead-frame 32A is typically incorporated into a memory card 70. In addition to the circuit module 62, the memory card 70 comprises a lid or skin 72. The skin 72 is attached to the body 54 of the circuit module 62 in the manner shown in FIG. 5. The skin 72 is formed to include angled surfaces, the slopes of which are complementary to the side surfaces 60 of the body 54, thus achieving a mating engagement therebetween. The attachment of the skin 72 to the circuit module 62 is preferably accomplished through the use of an adhesive. The attachment of the skin 72 to the circuit module 60 imparts to the completed memory card 70 a desired or prescribed form factor. When the skin 72 is attached to the circuit module 62, the top surface 56 of the body 54 is completely covered or shielded by the skin 72. If the semiconductor die 48 is oriented in the above-described die down configuration, the optional exposure of the top surface of the die pad 36, 36A within the top surface 56 of the body 54 would be of no consequence since such exposed top surface of the die pad 36, 36A would be covered by the skin 72. A label 74 may optionally be applied to the exposed top surface of the skin 72. In the completed memory card 70, any flash on the exposed bottom surfaces of the contacts 38, 38A is preferably removed through the implementation of a de-flash technique.

The memory card 70 has the form factor of a multi-media card. Those of ordinary skill in the art will recognize that the circuit module 62 may be employed in a memory card format other than a multi-media card format (e.g., a secure digital card format). Additionally, as an alternative to including the separate skin 72, insert molding using plastic molding processing techniques may be employed to facilitate the complete formation of the memory card 70. A more thorough discussion of various device configurations which may employ the use of the circuit module 62 including either the lead-frame 32 or lead-frame 32A is described in Applicant's co-pending U.S. application Ser. No. 10/266,329 entitled DIE DOWN MULTI-MEDIA CARD AND METHOD OF MAKING SAME filed Oct. 8, 2002, the disclosure of which is incorporated herein by reference.

Referring again to FIG. 5, it is contemplated that one or more of the fingers 46 of one or more of the reinforcement bars 42 may be bent upwardly or downwardly to provide additional strength in the z-direction. As shown in FIG. 5, the fingers 46 of one of the reinforcement bars 42 of the lead-frame 32 are depicted as being bent upwardly. As will be recognized, such bending preferably occurs at the same time the traces 40 are bent, and thus prior to the encapsulation of the lead-frame 32 with the body 54.

It is further contemplated that one or more of the fingers 46 of one or more of the reinforcement bars 42 may be provided with multiple bends so as to allow portions of each of the bent fingers 46 to act as heat fins. For example, the bent finger 46 shown in FIG. 5 includes a sloped portion which extends from the die pad 36 downwardly toward the bottom surface 58 of the body 54, a horizontal portion which extends in generally parallel relation to the bottom surface 58, and a distal sloped portion which extends upwardly toward the top surface 56 of the body 54. The bending of the finger 46 could be facilitated in a manner such that one surface of the horizontal portion of the bent finger 46 is exposed in and extends in substantially flush relation to either the top or bottom surface 56, 58 of the body 54. Provided that such bent finger 46 is integrally connected to a reinforcement bar 42 which is itself integrally connected to the die pad 36, the exposed surface of such finger 46 will act as a heat sink. The same holds true in relation to the lead-frame 32A shown in FIG. 4A, wherein portions of the reinforcement structure 64A can be selectively bent as needed to facilitate the heat dissipation functionality described above in relation to the lead-frame 32. In either case, a result of bending portions of either the reinforcement bars 42 or reinforcement structure 64A away from the midplane of the body 54 facilitates thermal conduction efficiency away from those memory modules that may generate excessive heat.

To provide even further structural integrity to any circuit module 62 including either the lead-frame 32 or lead-frame 32A, thermosets or thermoplastics used to form the body 54 may optionally be provided with fiber reinforcement or, alternatively, be modified by rubber for purposes of improving damage tolerance.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one of skill in the art in view of this disclosure.

What is claimed is:

1. A memory card comprising:
   a lead-frame having:
      at least one die pad;
      a plurality of contacts;

a plurality of conductive traces extending from respective ones of the contacts toward the die pad; and
at least one reinforcement bar;
a semiconductor die attached to the die pad and electrically connected to at least one of the traces; and
a body at least partially encapsulating the lead-frame and the semiconductor die such that the contacts are exposed within a bottom surface defined by the body and at least a portion of the body is reinforced by the reinforcement bar.

2. The memory card of claim 1 wherein the die pad is positioned between the contacts and the reinforcement bar.

3. The memory card of claim 1 wherein:
the traces are bent in a manner wherein the die pad and the contacts extend along respective ones of spaced, generally parallel frame planes; and
the semiconductor die is attached to the die pad so as to extend along a die plane which is disposed between and generally parallel to the frame planes.

4. The memory card of claim 3 wherein:
the die pad defines opposed, generally planar top and bottom surfaces;
each of the contacts defines opposed, generally planar top and bottom surfaces;
the semiconductor die is attached to the bottom surface of the die pad; and
the bottom surfaces of the contacts are exposed within and substantially flush with the bottom surface of the body.

5. The memory card of claim 3 wherein each of the traces defines a sloped portion extending between the die pad and the contacts.

6. The memory card of claim 1 further comprising a skin attached to the body in a manner covering a top surface thereof.

7. The memory card of claim 1 wherein:
the die pad defines opposed, generally planar top and bottom surfaces;
each of the contacts defines opposed, generally planar top and bottom surfaces;
the semiconductor die is attached to the top surface of the die pad; and
the bottom surfaces of the contacts are exposed within and substantially flush with the bottom surface of the body.

8. The memory card of claim 7 wherein the lead-frame is formed to include portions of reduced thickness such that the bottom surfaces of the contacts and the bottom surface of the die pad extend along respective ones of a spaced, generally parallel pair of planes.

9. The memory card of claim 1 wherein the reinforcement bar comprises:
an elongate base section; and
a plurality of fingers extending perpendicularly from the base section.

10. The memory card of claim 9 wherein the lead-frame includes at least two reinforcement bars oriented relative to each other such that the fingers thereof are interleaved in a manner forming a serpentine gap therebetween.

11. The memory card of claim 9 wherein the reinforcement bar is integrally connected to the die pad.

12. The memory card of claim 9 wherein at least one of the fingers is bent in a manner wherein at least a portion thereof is exposed in and substantially flush with at least one of the top and bottom surfaces of the body.

13. A method of fabricating a memory card, comprising the steps of:

(a) providing a lead-frame having at least one die pad, a plurality of contacts, a plurality of conductive traces extending from respective ones of the contacts toward the die pad, and at least one reinforcement bar, the die pad being positioned between the contacts and the reinforcement bar;
(b) attaching a semiconductor die to the die pad;
(c) electrically connecting the semiconductor die to at least one of the traces; and
(d) at least partially encapsulating the lead-frame and the semiconductor die with a body such that the contacts are exposed within a bottom surface defined by the body and at least a portion of the body is reinforced by the reinforcement bar.

14. A memory card comprising:
a lead-frame having:
a plurality of contacts;
a plurality of conductive traces extending from respective ones of the contacts; and
means for reinforcing a portion of the memory card;
a semiconductor die attached to the lead-frame and electrically connected to at least one of the traces; and
a body at least partially encapsulating the lead-frame and the semiconductor die such that the contacts are exposed within a bottom surface defined by the body and at least a portion of the body is reinforced by the reinforcing means.

15. The memory card of claim 14 further comprising a die pad positioned between the contacts and the reinforcing means.

16. The memory card of claim 15 wherein:
the traces are bent in a manner wherein the die pad and the contacts extend along respective ones of spaced, generally parallel frame planes; and
the semiconductor die is attached to the die pad so as to extend along a die plane which is disposed between and generally parallel to the frame planes.

17. The memory card of claim 16 wherein:
the die pad defines opposed, generally planar top and bottom surfaces;
each of the contacts defines opposed, generally planar top and bottom surfaces;
the semiconductor die is attached to the bottom surface of the die pad; and
the bottom surfaces of the contacts are exposed within and substantially flush with the bottom surface of the body.

18. The memory card of claim 14 further comprising a skin attached to the body in a manner covering a top surface thereof.

19. The memory card of claim 14 wherein:
the die pad defines opposed, generally planar top and bottom surfaces;
each of the contacts defines opposed, generally planar top and bottom surfaces;
the semiconductor die is attached to the top surface of the die pad; and
the bottom surfaces of the contacts are exposed within and substantially flush with the bottom surface of the body.

20. The memory card of claim 19 wherein the lead-frame is formed to include portions of reduced thickness such that the bottom surfaces of the contacts and the bottom surface of the die pad extend along respective ones of a spaced, generally parallel pair of planes.

* * * * *